(12) United States Patent
Kondo

(10) Patent No.: US 7,080,307 B2
(45) Date of Patent: Jul. 18, 2006

(54) ERROR CORRECTION DECODER WITH CORRECTION OF LOWEST SOFT DECISIONS

(75) Inventor: Hisashi Kondo, Chiyoda-ku (JP)

(73) Assignee: Kawasaki Steel Corporation, Kobe (JP)

( * ) Notice: Subject to any disclaimer, the term of this patent is extended or adjusted under 35 U.S.C. 154(b) by 573 days.

(21) Appl. No.: 09/959,339

(22) PCT Filed: Feb. 26, 2001

(86) PCT No.: PCT/JP01/01417

§ 371 (c)(1),
(2), (4) Date: Oct. 23, 2001

(87) PCT Pub. No.: WO01/65700

PCT Pub. Date: Sep. 7, 2001

(65) Prior Publication Data

US 2003/0051206 A1    Mar. 13, 2003

(30) Foreign Application Priority Data

Mar. 2, 2000  (JP)  ............................. 2000-056992
Mar. 3, 2000  (JP)  ............................. 2000-058847

(51) Int. Cl.
*H03M 13/29* (2006.01)
*H03M 13/45* (2006.01)
(52) U.S. Cl. ...................... 714/758; 714/780
(58) Field of Classification Search ............ 714/780, 714/790, 796, 758
See application file for complete search history.

(56) References Cited

U.S. PATENT DOCUMENTS 5,577,053 A * 11/1996 Dent ........................... 714/755
5,917,837 A *  6/1999 Stein .......................... 714/758
5,983,383 A * 11/1999 Wolf ........................... 714/755

(Continued)

FOREIGN PATENT DOCUMENTS

JP      A 2000-165260        6/2000

(Continued)

OTHER PUBLICATIONS

Sherwood et al., "Progressive Image Coding on NoisyChannels", Data Compression Conference, IEEE Comput. Soc, pp. 72-81, 1997.

(Continued)

*Primary Examiner*—Stephen M. Baker
(74) *Attorney, Agent, or Firm*—Oliff & Berridge, PLC

(57) ABSTRACT

An object of the present invention is to provide a decoder capable of improving accuracy of error correction. A demodulating section 11 demodulates received data Y and creates soft decision data. An error correction processing section 14 performs an error correction processing in accordance with a predetermined algorithm determined with the transmission side beforehand to create a bit sequence of data. A CRC section 15 performs a CRC test. A soft decision data correction section 13 is controlled in such a manner that in the event that no error is decided, the bit sequence of data is output in form of decoding data D, and in the event that an error is decided, a data correction control circuit 16 corrects soft decision data of lowest reliability from a memory 12 to soft decision data 6, 0 of higher reliability.

1 Claim, 5 Drawing Sheets

U.S. PATENT DOCUMENTS

| | | | |
|---|---|---|---|
| 6,029,264 A * | 2/2000 | Kobayashi et al. | 714/755 |
| 6,101,168 A * | 8/2000 | Chen et al. | 370/228 |
| 6,128,261 A * | 10/2000 | Suzuki | 369/47.48 |
| 6,138,260 A * | 10/2000 | Ketseoglou | 714/751 |
| 6,145,108 A * | 11/2000 | Ketseoglou | 714/751 |
| 6,192,500 B1 * | 2/2001 | Yang et al. | 714/786 |
| 6,278,685 B1 * | 8/2001 | Yonge et al. | 370/203 |
| 6,510,536 B1 * | 1/2003 | Crozier et al. | 714/755 |
| 6,606,724 B1 * | 8/2003 | Krieger et al. | 714/755 |
| 6,728,323 B1 * | 4/2004 | Chen et al. | 375/340 |

FOREIGN PATENT DOCUMENTS

| | | |
|---|---|---|
| JP | A 2000-183758 | 6/2000 |
| JP | A 2000-201085 | 7/2000 |
| JP | A 2001-44855 | 2/2001 |

OTHER PUBLICATIONS

Kuhn, "Applying List Output Viterbi Algorithms to a GSM-based Mobile Cellular Radio System", IEEE 6th, International Conference on Universal Personal Communications Record, vol. 2, Conf. 6, pp. 878-882, 1997.

1999 nen Sogo Taikai Kouen Ronbunshuu (Shibuya, Suda, Adachi), Denshi Joho Tsushin Gakkai, issued on Mar. 8, 1999, p. 541 ("Turbo-CRC Rensetsu Fygouka W-CDMA ni okeru Fukugou Shori Sakugen Kouka").

Slim Souisse et al., "Packet Combining Error Control for CDMA Systems", IEEE Third International Symposium on Oulu, Jul. 1994, pp. 248-252.

Krishna R. Narayanan et al., "Physical Layer Design for Packet Data Over IS-136", IEEE, Vehicular Technology Conference, May 4, 1997, pp. 1029-1033.

T. Sakai et al., "Soft-decision Viterbi Decoding with Diversity Combining", IEEE, Proceedings of the Global Telecommunications Conference and Exhibition, Dec. 2, 1990, pp. 1127-1131.

* cited by examiner

ERROR CORRECTION DECODER WITH CORRECTION OF LOWEST SOFT DECISIONS

TECHNICAL FIELD

The present invention relates to a decoder for applying a decoding processing to encoded data.

BACKGROUND ART

In a data communication and the like, in view of the fact that a decoder for performing a decoding processing for received data by means of performing an error correction processing involving a soft decision processing is more excellent in accuracy of an error correction as compared with a decoder for performing a decoding processing for received data by means of performing an error correction processing involving a hard decision processing, it is general to adopt the decoder involving the soft decision processing. In the hard decision processing, it is decided that the received data is associated with a logic '0' or a logic '1'. In the soft decision processing, a voltage between an 'L' level voltage indicative of a logic '0' and an 'H' level voltage indicative of a logic '1' is divided into several levels to decide which level the actually received data is associated with.

Further, hitherto, in a mobile communication and the like, in order to effectively transmit a plurality of data through a channel physically determined, an encoder at the transmission side transmits a data sequence obtained by means of deletion of a part of data or a supplement of the same data in accordance with a predetermined rule. A decoder at the receiving side decodes data in accordance with the predetermined rule in such a manner that when the decoder receives a data sequence wherein a part of data is deleted, the deleted data is supplemented, and when the decoder receives a data sequence wherein the same data is supplemented, the supplemented data is deleted, and further an error correction processing is performed.

A communication path of the actual communication system is easy to be affected by noises due to variations (fading) in the field strength of a radio wave. For this reason, it may happen that received data offers a middle level voltage between an 'L' level voltage representative of logic '0' and an 'H' level voltage representative of logic '1'. In the event that received data having such an indefinite level, it may happens that a decoder involving the soft decision processing is degraded in correction accuracy and is elongated in time until it converges on a desired error correction accuracy.

Further, due to the above-mentioned fading occurence, an electric power of received data is in part weakened or a phase of a wave representative of the received data is changed, and as a result, a reliability of a part of data of the received data is degraded. Under such a state, in the event that a data sequence wherein the same data is supplemented is received, it may happen that only the data of lower reliability is selected in connection with a procedure of deletion of the same data in accordance with a predetermined rule. In such a case, although the data of higher reliability is received, the data of higher reliability is annulled, so that error correction ability may be lowered. Thus, it may happen that it is difficult to decode the transmitted data with great accuracy.

Japanese Patent Laid Open Gazette Hei. 10-303759 proposes a technique of correcting a bit sequence after an error correction processing.

FIG. 5 is a block diagram of a decoder proposed in Japanese Patent Laid Open Gazette Hei. 10-303759.

A decoder 100 shown in FIG. 5 comprises demodulating means 110, Viterbi decoding means 120, CRC means 130 and bit inverting means 140.

The demodulating means 110 receives, in unit of a predetermined data sequence, received data Y modulated in accordance with predetermined modulation techniques. The demodulating means 110 demodulates the entered received data Y, and generates soft decision data in accordance with amplitude and phase of a wave representative of the received data Y and outputs the same to the Viterbi decoding means 120.

The Viterbi decoding means 120 performs an error correction processing in accordance with a predetermined algorithm determined between the receiving side and the transmission side beforehand, based on the soft decision data output from the demodulating means 110, and decodes the processed data to a bit sequence of data, and further adds reliability information to the bit sequence of data and then outputs the same to the CRC means 130.

The CRC means 130 performs a CRC test for the entered bit sequence of data. As a result of the CRC test, in the event that no error is decided, data of the bit sequence is output in form of decoding data D. On the other hand, in the event that an error is decided, data of the bit sequence is output toward the bit inverting means 140.

The bit inverting means 140 performs a bit inversion for data of the entered bit sequence in order that the sum of reliability information of the inverted bits becomes smaller to generate data of a new bit sequence and feedback the same to the CRC means 130. In this manner, the processing by the CRC means 130 and the bit inverting means 140 is repeated until no error is decided, so that accuracy in error correction is enhanced and a time up to converging on a desired error correction accuracy is reduced.

However, the repeated processing by the CRC means 130 and the bit inverting means 140 does not consider characteristics of the demodulation algorithm used, since it is based on data of the bit sequence subjected to the hard decision processing from the Viterbi decoding means 120. Accordingly, it is insufficient in accuracy of the error correction. Further, there is a possibility that the number of times of bit inversion is increased. Accordingly, there is a possibility that a total time of the decoding processing is lengthened.

DISCLOSURE OF THE INVENTION

In view of the foregoing, it is an object of the present invention to provide a decoder capable of decoding data with great accuracy with enhancement of error correction ability.

To achieve the above-mentioned object, the present invention provides a first decoder comprising an error correction processing section for performing an error correction processing involving a soft decision processing, and a hard decision result determining section for determining correctness of a result of hard decision, wherein the decoder receives encoded data in unit of a predetermined data sequence and, wherein the decoder further comprises a soft decision data correcting section for forcibly correcting data of lower reliability in the data sequence to data indicative that the reliability is high, and correction of data by the soft decision data correcting section, the error correction processing by the error correction processing section and hard decision result determining processing by the hard decision result determining section are repeatedly performed until the hard decision result determining section decides that the result of hard decision is right.

According to the first decoder of the present invention, an error correction processing is performed in such a manner that data of lower reliability in soft decision data is forcibly corrected to data indicative that the reliability is high. Thus, the error correction processing is performed in accordance with a predetermined algorithm determined with the transmission side beforehand. Therefore, as compared with conventional technique of inverting bits in a bit sequence subjected to the hard decision processing, according to the present invention, it is expected that an effect of bit inversion appears on a plurality of corrected bits, and thus enhancement of an error correction accuracy and reduction of a processing time are achieved.

In the first decoder of the present invention as mentioned above, it is preferable that the soft decision data correcting section corrects data to the data indicative that the reliability is high in order of data lower in reliability.

Correction of data in order of the lowness in reliability makes it possible to reduce on a possibility basis a time until a decision result of no error is obtained, and further reduction of the processing time is achieved.

Further, in the first decoder of the present invention as mentioned above, it is acceptable that the soft decision data correcting section corrects data by a predetermined number of times, even if the hard decision result determining section determines that the result of hard decision is error.

In the event that errors continue for a long time, the processing is terminated in a predetermined number of times. This feature makes it possible to reduce the processing time.

Further, to achieve the above-mentioned object, the present invention provides a second decoder comprising:

a soft decision data creating section for demodulating received data to create soft decision data;

a same data detecting section for detecting a plurality of pieces of same data repeatedly transmitted from among the received data;

a same data processing section for obtaining one soft decision data corresponding to the same data by adopting a plurality of pieces of soft decision data obtained by the soft decision data creating section, of the plurality of pieces of same data detected by the same data detecting section; and an error correction processing section for performing an error correction processing on soft decision data after processing by the same data processing section.

In the event that a data sequence, to which the same data is added, is transmitted, basically, the original data is randomized in order of transmission owing to interleaving processing and the like. For this reason, even if a certain data of a plurality of pieces of same data in the received data is degraded in reliability owing to occurrence of fading and the like, it often happens that other data of the plurality of pieces of same data are high in reliability. The second decoder of the present invention is made turning one's attention to this viewpoint.

According to the second decoder of the present invention, one soft decision data is obtained from among a plurality of pieces of soft decision data corresponding to a plurality of pieces of same data in the received data, and the error correction processing is performed on the one soft decision data. Accordingly, even if a certain data of a plurality of pieces of same data repeatedly transmitted in the received data is degraded in reliability owing to occurrence of fading and the like in the communication path, the error correction processing is performed using other data of higher reliability. Therefore, an ability of the error correction is enhanced and thus it possible to decode data with great accuracy.

In the second decoder of the present invention as mentioned above, it is preferable that the same data processing section adopts soft decision data of highest reliability from among the plurality of pieces of soft decision data created by the soft decision data creating section, which correspond to the plurality of pieces of same data, as one soft decision data corresponding to the same data.

Adoption from among soft decision data of highest reliability from among the plurality of pieces of soft decision data makes it possible to readily obtain soft decision data for performing the error correction processing.

Further, in the second decoder of the present invention as mentioned above, it is also preferable that the same data processing section adopts an average value of the plurality of pieces of soft decision data created by the soft decision data creating section, which correspond to the plurality of pieces of same data, as one soft decision data corresponding to the same data.

Adoption of the average value of the plurality of pieces of soft decision data makes it possible to obtain soft decision data for performing the error correction processing with great accuracy.

Furthermore, in the second decoder of the present invention as mentioned above, it is acceptable that the decoder further comprises a hard decision processing section for obtaining a result of hard decision of the soft decision data created by the soft decision data creating section, and the same data processing section creates soft decision data corresponding to the same data in accordance with a result of hard decision in the hard decision processing section for the plurality of pieces of soft decision data created by the soft decision data creating section, which correspond to the plurality of pieces of same data.

As mentioned above, the plurality of pieces of soft decision data are subjected to the hard decision, the soft decision data for performing the error correction processing are created in accordance with a result of hard decision. This feature makes it possible to perform more simple arithmetic processing, as compared with a case where a plurality of pieces of soft decision data is subjected to an arithmetic processing to obtain soft decision data for performing the error correction processing.

BEST MODE FOR CARRYING OUT THE INVENTION

Embodiments of the present invention will be described hereinafter.

Figure 1:
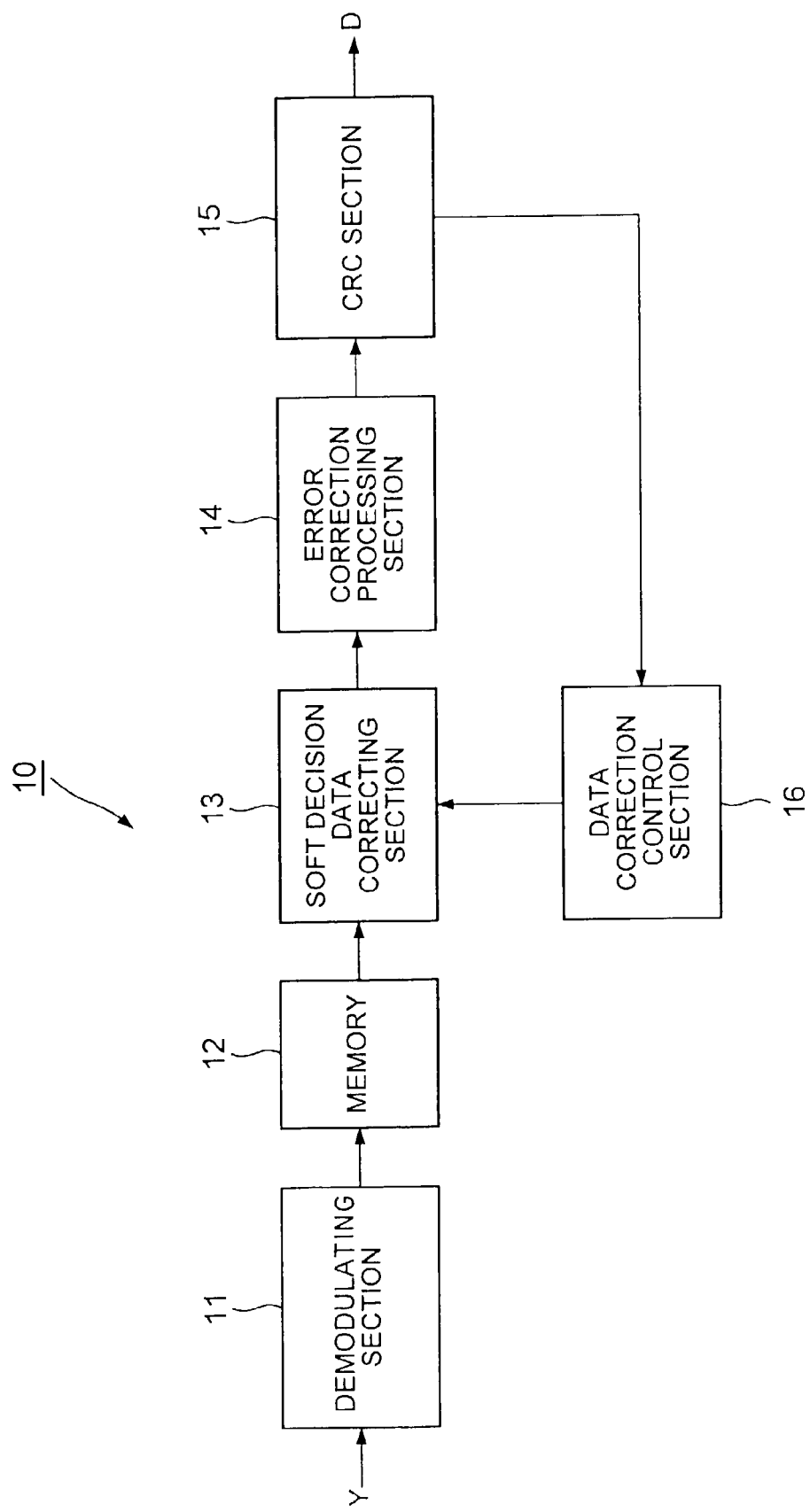
FIG. 1 is a block diagram of a decoder of a first embodiment of the present invention.

FIG. 1 is a block diagram of a decoder of a first embodiment of the present invention.

A decoder 10 shown in FIG. 1 comprises a demodulating section 11, a memory 12, a soft decision data correcting section 13, an error correction processing section 14, a CRC section 15 and a data correction control section 16.

The demodulating section 11 receives, in unit of error correction block, received data Y modulated in a predetermined modulation technique. The demodulating section 11 demodulates the entered received data Y and generates soft decision data in accordance with amplitude and phase of the wave representative of the received data Y. Here, it will be explained assuming that seven-valued of soft decision data 0–6, wherein a voltage between an 'L' level voltage representative of logic '0' and an 'H' level voltage representative of logic '1' is divided into 7 step-levels is dealt. Typically, soft decision data 6 and 0 corresponds to data indicative of a high reliability referred to in the present invention, and soft decision data 3 corresponds to data indicative of a low reliability referred to in the present invention.

The memory 12 stores therein the soft decision data created by the demodulating section 11 in unit of an error correction block wherein the soft decision data are sorted in order of the shortness of distance from the soft decision data 3 that is neutral data (in order of the lowness of reliability). For example, in the event that the soft decision data 4 and 6 are stored, a distance between the soft decision data 4 and the neutral data is 4−3=1, and a distance between the soft decision data 6 and the neutral data is 6−3=3. Thus, the soft decision data 4 is shorter in a distance from the neutral data than the soft decision data 6. Accordingly, the memory 12 stores therein the soft decision data 4 and the soft decision data 6 in the named order, that is, in order of the lower reliability. Incidentally, as the memory 12, it is acceptable that other data storage means such as registers is used.

The soft decision data correcting section 13 corrects soft decision data in unit of an error correction block in a manner as will be described later. Incidentally, at the first, a block of soft decision data from the memory 12 is output to the error correction processing section 14 as it is.

The error correction processing section 14 performs an error correction processing for a block of soft decision data output from the soft decision data correcting section 13 in accordance with a predetermined algorithm determined with the transmission side beforehand and outputs a binary bit sequence of data.

The CRC section 15 performs a CRC test for the bit sequence of data, and outputs the bit sequence of data in form of decoding data D in the event that no error is decided. On the other hand, in the event that an error is decided, it is transmitted to the data correction control section 16.

Upon receipt of notice of a decision of an error from the CRC section 15, the data correction control circuit 16 controls the soft decision data correcting section 13 in such a manner that the soft decision data of lowest reliability of the above-mentioned one block of soft decision data, that is, the soft decision data shortest in the distance from the neutral data, is corrected to the soft decision data 6 of higher reliability. The soft decision data correcting section 13 corrects the soft decision data of lowest reliability to the soft decision data 6. The one block of soft decision data, which is corrected by the soft decision data correcting section 13, is again subjected to the error correction processing in the error correction processing section 14 in accordance with a predetermined algorithm. Thus, a new bit sequence of data is generated, and then the CRC test is again performed in the CRC section 15.

As a result of the CRC test, in the event that no error is decided, the new bit sequence of data is output in form of the decoding data D. On the other hand, in the event that an error is decided, it is transferred to the data correction control circuit 16.

Upon receipt of notice of a decision of an error from the CRC section 15 again, the data correction control circuit 16 controls the soft decision data correcting section 13 in such a manner that the soft decision data of lowest reliability of the above-mentioned one block of soft decision data is corrected to the soft decision data 0 of higher reliability. The soft decision data correcting section 13 corrects the soft decision data of lowest reliability to the soft decision data 0. The one block of soft decision data, which is corrected by the soft decision data correcting section 13, is again subjected to the error correction processing in the error correction processing section 14 in accordance with a predetermined algorithm. Thus, a new bit sequence of data is generated, and then the CRC test is performed in the CRC section 15. In the event that no error is decided, the bit sequence is output in form of the decoding data D. On the other hand, in the event that an error is decided, corrections are performed in order of soft decision data of lower reliability until no error is decided in such a manner that soft decision data, which is lower reliability subsequent to the soft decision data of lowest reliability, is corrected to the soft decision data 6, 0. Incidentally, even if an error is decided, it is acceptable that correction is performed by a predetermined time of numbers to determine a decoding result. This feature makes it possible to reduce a processing time.

In the event that a block of bit sequence of data includes a plurality of soft decision data to be corrected, it is either acceptable that a part of the soft decision data to be corrected is corrected, or all the soft decision data to be corrected are corrected. In the event that all the soft decision data are simultaneously corrected, it is possible to reduce the processing time.

According to the present embodiment, the soft decision data of lower reliability is forcibly corrected to the soft decision data 6, 0 indicative of high reliability, and the error correction processing is performed in accordance with a predetermined algorithm determined with the transmission side beforehand. Accordingly, as compared with conventional technique of inverting bits in a bit sequence subjected to the hard decision processing, according to the present embodiment, it is possible to more enhance an error correction accuracy and also to more reduce a processing time.

Further, according to the present embodiment, in the event that an error is decided through the CRC test, the error correction is performed by forcibly correcting to the soft decision data 6, 0 indicative of high reliability in order of the lowness of reliability soft decision data are concerned with. Accordingly, it is possible to effectively perform an error correction processing in order of unreliable data and also contribute to further reduction of the processing time.

According to the present embodiment, there has been explained an embodiment in which the error correction is performed by correcting to the soft decision data 6, 0 in order of the lowness of reliability soft decision data are concerned with on all the soft decision data. However, it is acceptable that the error correction is performed by correcting only the soft decision data of lowest reliability to the soft decision data 6, 0. Also it is acceptable not only to correct soft decision data of lower reliability to the soft decision data 6, 0, but also to correct soft decision data of lower reliability to the neutral data such as 4, 5. This feature makes it possible to further reduce the processing time.

Figure 2:
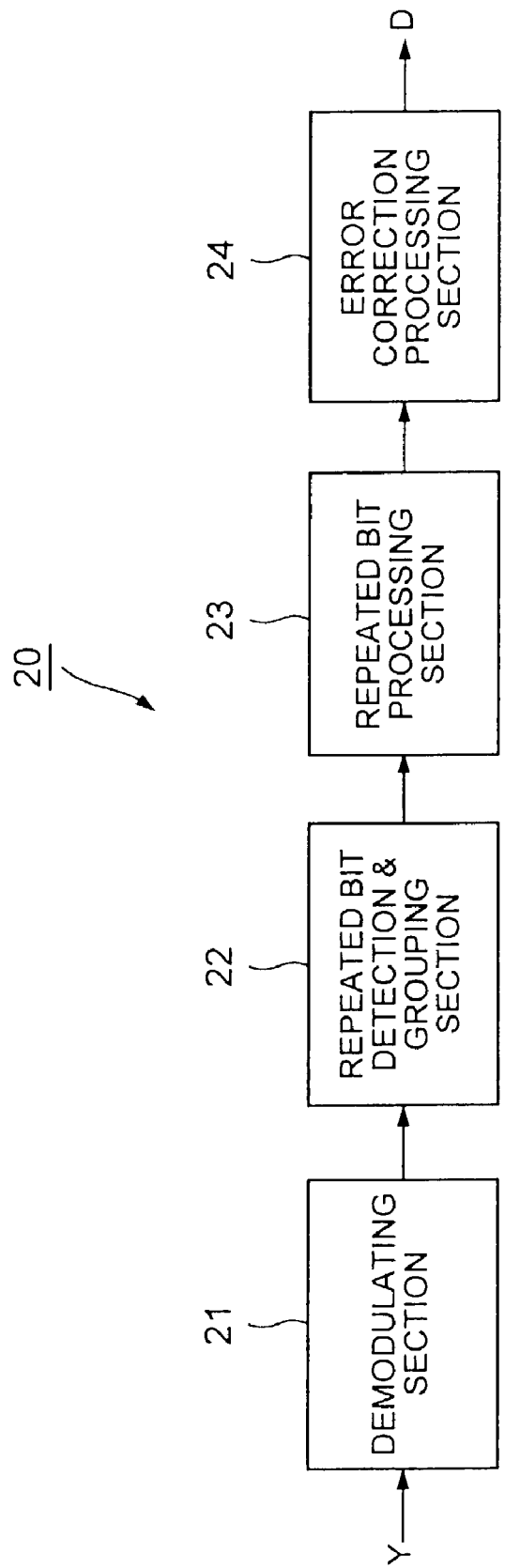
FIG. 2 is a block diagram of a decoder of a second embodiment of the present invention.

FIG. 2 is a block diagram of a decoder of a second embodiment of the present invention.

A decoder 20 shown in FIG. 2 comprises a demodulating section 21, a repeated bit detection & grouping section 22, a repeated bit processing section 23 and an error correction processing section 24.

A demodulating section 21 corresponds to the soft decision data creating section referred to in the present invention. The demodulating section 21 receives the received data Y. The received data Y is a data sequence in which repeating processing for the same data is performed at the transmission side, and those data are sequentially written into a memory and then read from the memory in accordance with a predetermined algorithm, so that an interleaving processing of stirring an order of data is applied and the data is modulated in accordance with a predetermined modulation technique. The demodulating section 21 demodulates this received data Y and creates soft decision data in accordance with amplitude and phase of a wave representative of the received data Y. Here, it will be explained assuming that seven-valued of soft decision data 0–6, wherein a voltage between an 'L' level voltage representative of logic '0' and an 'H' level voltage representative of logic '1' is divided into 7 step-levels, is dealt. Typically, soft decision data 6 and 0 corresponds to data indicative of a high reliability, and soft decision data 3 corresponds to data indicative of a low reliability.

The repeated bit detection & grouping section 22 corresponds to the same data detection section referred to in the present invention. The repeated bit detection & grouping section 22 receives soft decision data from the demodulating section 21. The repeated bit detection & grouping section 22 detects repeated bit of soft decision data of the entered soft decision data in accordance with the above-mentioned predetermined algorithm and groups the detected bits of soft decision data into one group.

The repeated bit processing section 23 corresponds to the same data processing section referred to in the present invention. The repeated bit processing section 23 adopts the soft decision data largest in a received level of the grouped soft decision data, or the soft decision data of highest reliability from among a plurality of soft decision data corresponding to a plurality of pieces of same data, as a piece of soft decision data corresponding to those same data. For example, in case of the grouped soft decision data 6, . . . , 3, . . . , 5, . . . , 5, . . . , 6 (. . . denotes data by an effect subjected to the interleaving processing, and 3 denotes data be most greatly affected by fading), the repeated bit processing section 23 adopts soft decision data 6 that is farthest away from the soft decision data 3 or the neutral data. In this manner, the repeated bit processing section 23 adopts only one soft decision data of highest reliability in one group.

The error correction processing section 24 performs an error correction processing using the soft decision data of high reliability output from the repeated bit processing section 23 by the well known technique: Viterbi decoding or turbo decoding to create binary bit sequence of data, and further performs a CRC test for the created binary bit sequence of data. In the event that no error is decided, the error correction processing section 24 outputs the binary bit sequence of data in form of the decoding data D. On the other hand, in the event that an error is decided, the error correction processing section 24 further performs the error correction.

As described above, the decoder 20 according to the present embodiment, a piece of soft decision data is obtained from among a plurality of pieces of soft decision data corresponding to a plurality of same data in the received data Y, and an error correction processing is performed on the piece of soft decision data. Accordingly, in the event that a communication path includes a section that is bad in condition of a radio wave owing to fading and the like, even if reliability of a certain data of a plurality of pieces of same data repeatedly transmitted in the received data Y is degraded, an error correction processing is performed using another data of highest reliability. Therefore, according to the present embodiment, it is possible to enhance error correction ability and decode data with great accuracy. Further, the repeated bit processing section 23 adopts the soft decision data of highest reliability from among a plurality of pieces of soft decision data corresponding to a plurality of pieces of same data, created in the demodulating section 21, as one soft decision data corresponding to those same data. Therefore, it is possible to easily obtain a soft decision data for performing an error correction processing.

Next, there will be explained a decoder of a third embodiment of the present invention.

Figure 3:
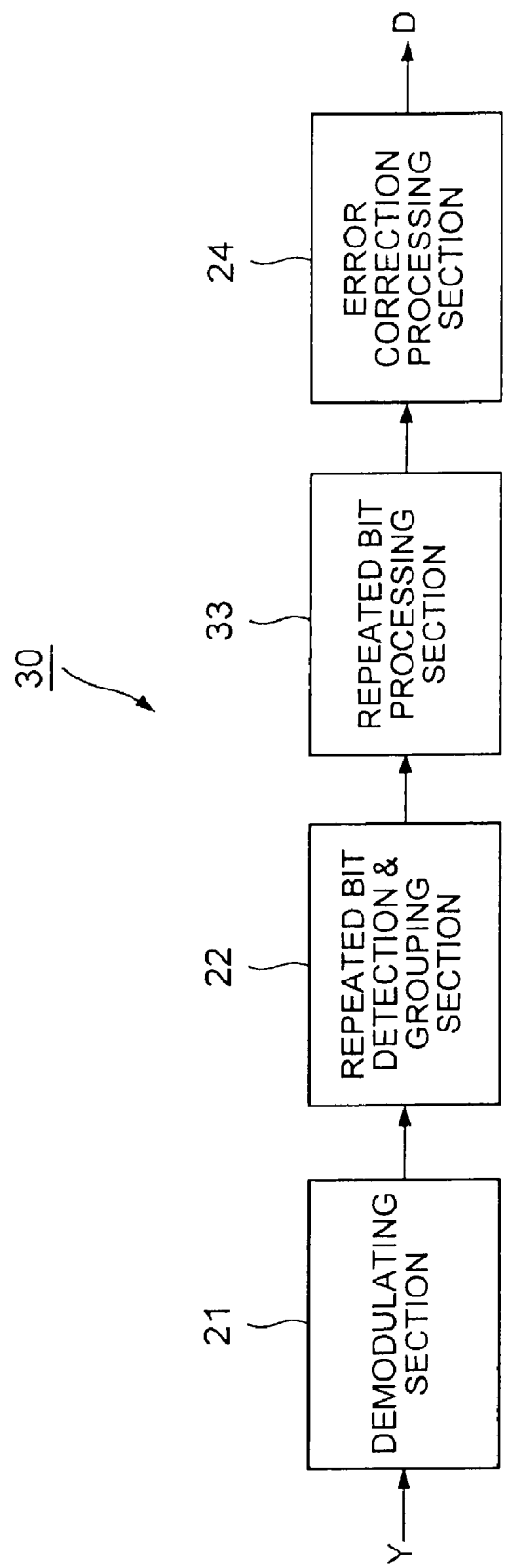
FIG. 3 is a block diagram of a decoder of a third embodiment of the present invention.

FIG. 3 is a block diagram of a decoder of a third embodiment of the present invention.

A decoder 30 shown in FIG. 3 is different from the decoder 20 of the first embodiment in a repeated bit processing section 33. The repeated bit processing section 33 adopts an average value of a plurality of pieces of soft decision data corresponding to a plurality of pieces of same data, created in the demodulating section 21, as one soft decision data corresponding to those same data.

For example, for the purpose of simplification, assuming that all the soft decision data grouped into one group are five soft decision data 6, 3, 5, 5, 6, the average value {6+3+5+5+6}/5=5, or the soft decision data 5 is adopted. Hereinafter, in a similar fashion to that of the decoder 20 of the second embodiment as mentioned above, the error correction processing section 24 performs the error correction using the soft decision data 5 to create the binary bit sequence of data and performs the CRC test to determine decoding data D.

As mentioned above, according to the decoder 30 of the third embodiment, the repeated bit processing section 33 adopts the average value of a plurality of pieces of soft decision data. This feature makes it possible to enhance accuracy of soft decision data for performing an error correction processing.

Further, there will be explained a decoder of a fourth embodiment of the present invention.

Figure 4:
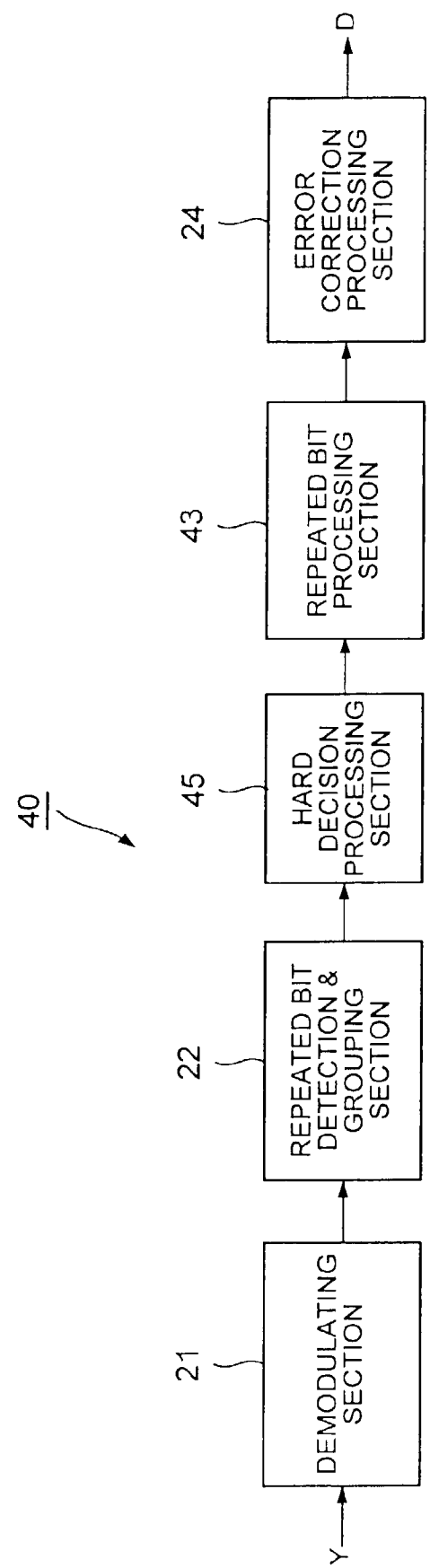
FIG. 4 is a block diagram of a decoder of a fourth embodiment of the present invention.
Figure 5:
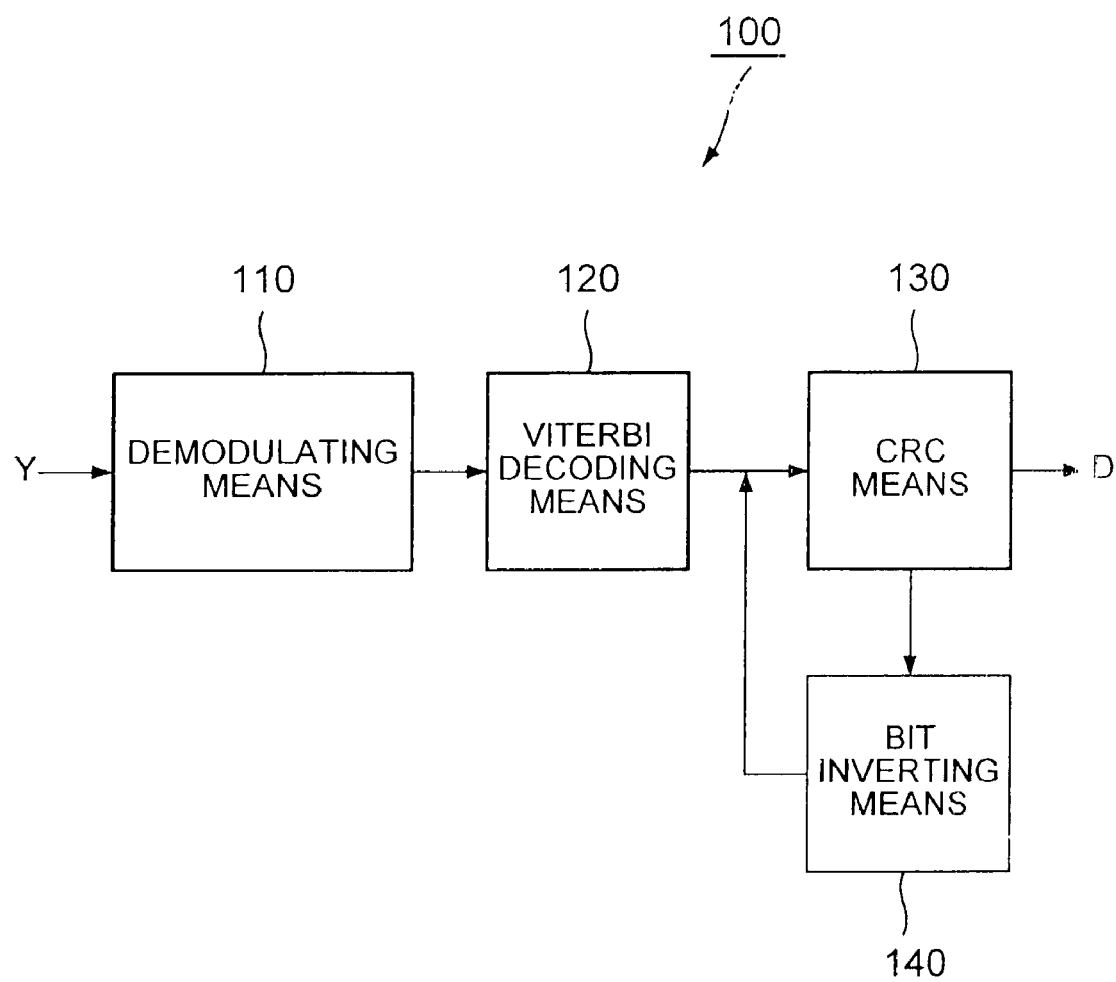
FIG. 5 is a block diagram of a decoder proposed in Japanese Patent Laid Open Gazette Hei. 10-303759.

FIG. 4 is a block diagram of a decoder of a fourth embodiment of the present invention.

A decoder 40 shown in FIG. 4 comprises a hard decision processing section 45 for obtaining a result of hard decision of soft decision data. Further, the decoder 40 comprises a repeated bit processing section 43 for creating a soft decision data corresponding to the same data in accordance with a result of hard decision by the hard decision processing section 45 for the plurality of pieces of soft decision data corresponding to the plurality of pieces of same data, which is created in the demodulating section 21.

In the decoder 40, the hard decision processing section 45 performs a hard decision processing as to which one is concerned between logic '0' and logic '1' for all the soft decision data grouped into one by the repeated bit detection & grouping section 22, and repeatedly transfers to the repeated bit processing section 43 a result of hard decision processing and the soft decision data received from the repeated bit detection & grouping section 22. The repeated bit processing section 43 adopts the soft decision data corresponding to the logic larger in number of the logic '0' and the logic '1' subjected to the hard decision processing. For example, in the event that the soft decision data 6, 3, 5, 5, 6, which are grouped into one, are subjected to the hard decision processing, the hard decision data 1, ?, 1, 1, 1 (since the soft decision data 3 is the neutral data, it does not belong to any of 0 and 1) can be obtained. Here, four data out of five soft decision data 6, 3, 5, 5, 6, are decided as the hard decision data 1, and thus finally the repeated bit processing section 43 adopts the soft decision data 6 corresponding to the hard decision data 1. In the event that it is difficult in judgement of 1 or 0 for the hard decision data, for example, in the event that the numbers decided as 1 and 0 are the same as one another, it is possible to adopt a value near the neutral value. Hereinafter, the error correction processing section 24 performs an error correction processing using the soft decision data 6 to create a binary bit sequence of data for a CRC test, and determines decoding data D.

As mentioned above, according to the decoder 40 of the fourth embodiment, a plurality of pieces of soft decision data is subjected to a hard decision, and soft decision data for performing the error correction processing is created in accordance with a result of the hard decision. Thus, according to the decoder 40 of the fourth embodiment, as compared with a case where soft decision data for performing the error correction processing is obtained through performing an arithmetic processing for a plurality of pieces of soft decision data, it is possible to perform more simple arithmetic processing.

What is claimed is:

1. A decoder comprising an error correction processing section for performing an error correction processing involving a soft decision processing, and a hard decision result determining section for determining correctness of a result of hard decision, wherein the decoder receives encoded data in unit of a predetermined data sequence and, wherein the decoder further comprises a soft decision data correcting section for forcibly correcting soft decision data of lower reliability in the data sequence to soft decision data indicative of high reliability, and correction of soft decision data by the soft decision data correcting section, the error correction processing by the error correction processing section and hard decision result determining processing by the hard decision result determining section are repeatedly performed until the hard decision result determining section decides that the result of hard decision is right, wherein the soft decision data correcting section corrects data to high reliability data, in order of reliability lowness.

* * * * *